United States Patent [19]

Göbel et al.

[11] Patent Number: 4,984,730
[45] Date of Patent: Jan. 15, 1991

[54] QUALITY CONTROL FOR WIRE BONDING

[75] Inventors: Bernd Göbel, Inning am Holz; Andreas Ziemann, Erding, both of Fed. Rep. of Germany

[73] Assignee: Emhart Inc., Towson, Md.

[21] Appl. No.: 432,092

[22] Filed: Nov. 3, 1989

[30] Foreign Application Priority Data

Nov. 11, 1988 [GB] United Kingdom ............... 8826488

[51] Int. Cl.$^5$ ..................... B23K 20/10; H01L 21/607
[52] U.S. Cl. ........................................... 228/1.1; 228/9
[58] Field of Search .............. 228/110, 1.1, 4.5, 179, 228/102, 103

[56] References Cited

U.S. PATENT DOCUMENTS

| 4,746,051 | 5/1988 | Peter | 228/110 |
| 4,789,095 | 12/1988 | Kobayashi | 228/1.1 |

FOREIGN PATENT DOCUMENTS

| 0208310 | 1/1987 | European Pat. Off. | 228/110 |
| 149577 | 11/1979 | Japan | 228/110 |
| 124240 | 9/1980 | Japan | 228/4.5 |
| 184734 | 10/1983 | Japan | 228/4.5 |
| 214441 | 9/1986 | Japan | 228/4.5 |
| 123728 | 1/1987 | Japan | 228/110 |
| 1109292 | 8/1984 | U.S.S.R. | 228/110 |

Primary Examiner—Sam Heinrich
Attorney, Agent, or Firm—Spencer T. Smith

[57] ABSTRACT

An automatic wire bonding apparatus, for wedge-bonding using aluminium wire, comprises a bonding head comprising a bonding tool mounted on an ultrasonic transducer, a bonding tip of the tool being arranged, in the operation of the machine, to press aluminium wire against the contact surface of an electronic or electrical component, the wire being drawn from a suitable wire supply, and a wire clamp by which the wire drawn from the wire supply may be clamped, the wire clamp being movable backward and forward generally in the direction in which the wire is fed appropriately to position the free end of wire drawn from the spool after completion of a bonding operation. The automatic wire-bonding apparatus further comprises means for monitoring, during bonding, the quality of the bond formed between the wire and the surface to which it is to be bonded, by identifying those bonds which do not fall within predetermined maximum and minimum values for deformation of the wire due to ultrasonic excitation. By using the automatic wire bonding apparatus described, the time during which ultrasonic energy is transmitted to the bond is minimized, thus maximizing the throughput of the machine, and wastage due to unsatisfactory bond formation is reduced.

3 Claims, 2 Drawing Sheets

U.S. Patent      Jan. 15, 1991      Sheet 1 of 2      4,984,730
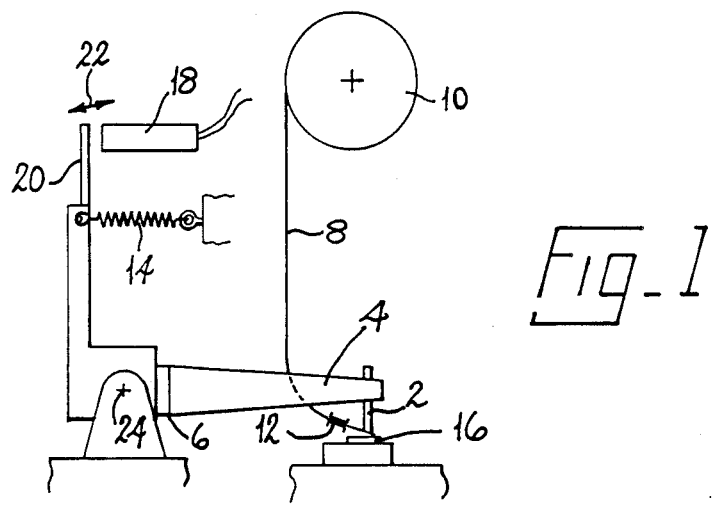
Fig_1
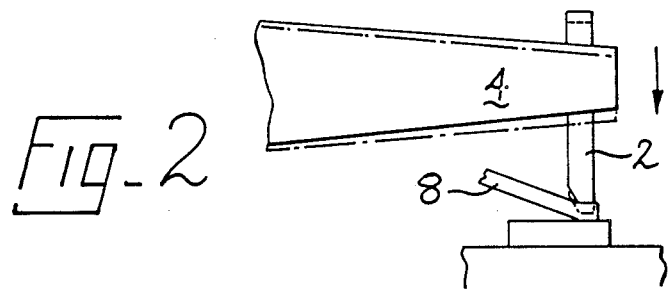
Fig_2
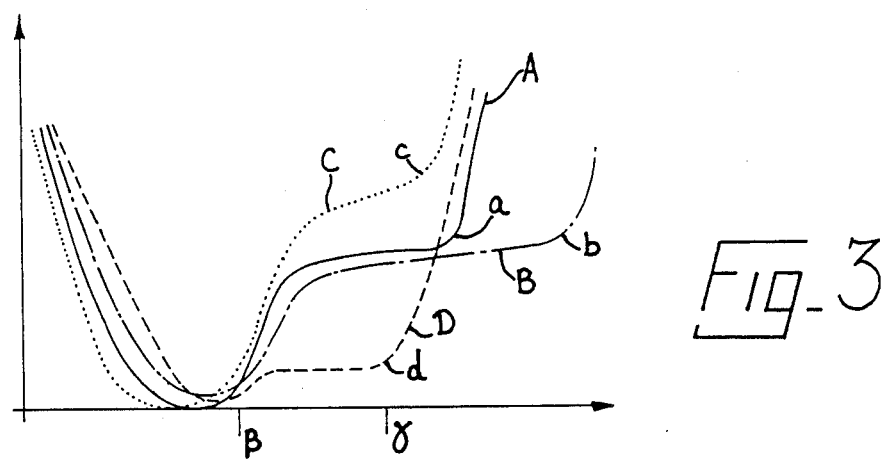
Fig_3

QUALITY CONTROL FOR WIRE BONDING

BACKGROUND OF THE INVENTION

The present invention relates to an apparatus for automatic wire bonding, in particular wedge bonding using aluminium wire, which apparatus includes means for monitoring, during the bonding process, the quality of the bond between the wire and the surface to which it is to be bonded.

Wire bonding is the process of making electrical connections in semiconductor components by means of fine metal wire, typically wire with a diameter of from 12 microns to 500 microns. Examples of electrical connections which can be made using wire bonding techniques include connections between the contact surfaces of discrete or integrated chips and the contact leads of their packages, and, in the case of hybrid circuits, the connections between inserted monolithic elements and the film circuit which contains them.

A number of wire bonding techniques have been developed, and one which has been particularly successful is a microwelding technique using ultrasound. An automatic wire bonding apparatus on which such a technique can be operated is described in German Patent Application No. P 33 43 738. Aluminium wire, in contact with the contact surface to which it is to be bonded, is moved vigorously in the direction of the surface to which it is to be bonded so that its oxide layer breaks open. The wire is then subjected to pressure, and a permanent junction is created between the two materials. Motion of the wire is generated by an ultrasonic transducer excited by an ultrasonic generator to produce high-frequency mechanical vibrations.

In the particular wire bonding process known as wedge bonding, the ultrasonic energy is supplied in the range of 1 to 50 watts, depending on the wire size used. The ultrasonic energy is directed to the aluminium wire by a special tool known as a "wedge". The wire is fed through a hole at the bottom of the wedge. When the wedge with the aluminium wire touches the surface to which the wire is to be bonded, movement is stopped. The wire is pressed down with a small defined force, known as the bonding weight, and the wire is slightly deformed. This small deformation is known as the "pre-deformation". Ultrasonic energy is now switched on, and the welding process starts. During this time, the diameter of the aluminium wire is reduced by a few microns, the actual reduction depending on the size, physical properties and the precise chemical nature of the wire.

It is important in an automatic wire bonding apparatus to have as much control as possible over the process, and to be able to determine whether or not a bond has been successfully made. In particular, it is important to be able to ascertain when the wedge with the aluminium wire touches the surface to which the wire is to be bonded, so that movement of the wedge can be stopped. It would also be very useful for the operator of the wire bonding apparatus to ascertain whether a bond has been successfully made at the time of bonding rather than during a subsequent test routine. Because of the very rapid throughput of an automatic wire bonding apparatus, it would be advantageous if the bonding could be monitored immediately at the time of bonding, so that after the formation of an unsatisfactory bond the process can be stopped and the bonding conditions checked to prevent the production of a large number of unsatisfactory bonds, with the consequent wastage of time and expensive components and materials.

Most wire bonding machines currently in commercial use are only able to check whether a successful bond has been made after bonding is completed, using a test known as the loop-pull test. This test is typically used as a destructive test method in which samples are tested to destruction by pulling the loop between two bonds and noting the breaking force which is required, and the point at which the break occurs. In general, bonding is considered to be satisfactory if the wire breaks at the point approximately equidistant between the two bonds at which the force is applied; if the break occurs at the bond itself, with the wire lifting away from the surface to which it was supposed to be bonded, then this is due to the bonding being insufficient. If, alternatively, the wire breaks close to the bond, at the so-called heel, then this is generally the result of over-bonding, when too much pressure or too much ultrasonic energy has been applied to the wire, and the wire has been too highly deformed.

A number of methods have been proposed to check at the time of bonding whether or not a successful bond has been produced, but none of these proposed methods is totally successful, or suitable for the full range of bonds which the apparatus is required to make. In addition, these proposed methods have required expensive equipment.

One method which has been proposed is to determine whether there is an electrical contact between the aluminium wire and the surface to which it is to be bonded. This method can only be used when the surface is one which can be connected to a definite voltage. In practice, this means that the method can only be used where bonding is to a lead frame.

In an alternative proposal, data from a number of good bonds—frequency and current of the ultrasonic generator used for welding—is sampled electronically, and reference values are produced, against which similar data from all subsequent bonds is compared. This method works well with units with reproducible manufacturing parameters such as lead frames, but is not suitable in commercial hybrid applications where components and bonds have broad tolerances.

Alternative proposals include measuring the amount of aluminium wire used, and measuring the deflection of the transducer, which converts electrical signals to mechanical movement, during bonding. Neither of these proposals have proved satisfactory in practice.

BRIEF SUMMARY OF THE INVENTION

It is an object of the present invention to provide an automatic wire bonding apparatus in which the above disadvantages are reduced or substantially obviated and, in particular to provide an automatic wire bonding apparatus in which bond formation can be monitored at the time of bonding.

The present invention provides an automatic wire bonding apparatus, for wedge-bonding using aluminium wire, which apparatus comprises a bonding head comprising a bonding tool mounted on an ultrasonic transducer, a bonding tip of the tool being arranged, in the operation of the machine, to press aluminium wire against the contact surface of an electronic or electrical component, the wire being drawn from a suitable wire supply, and a wire clamp by which the wire drawn from the wire supply may be clamped, the wire clamp being movable backward and forward generally in the direction in which the wire is fed appropriately to position the free end of wire drawn from the spool after completion of a bonding operation, characterised in that the automatic wire-bonding apparatus further comprises means for monitoring, during bonding, the quality of the bond formed between the wire and the surface to which it is to be bonded, by identifying those bonds which do not fall within predetermined maximum and minimum values for deformation of the wire due to ultrasonic excitation.

The means according to the invention for monitoring the quality of the bond during bonding, can be used to determine whether or not a bond is successfully formed, and can also be used to determine whether the bond satisfies the requirements defined for its proposed end use.

The means according to the invention for monitoring the quality of the bond comprises a sensor for determining the change in position of the wedge during the bonding process. Suitable sensors include linear response distance measuring sensors, in particular linear response moving coil sensors or optical sensors. Linear response moving coil sensors, for example a 1 Mhz L-C resonator with a linear change of output amplitude, have proved to be particularly suitable.

The automatic wire bonding apparatus according to the invention preferably further comprises means for comparing, during bonding, the relative deformation/time curve for each bond against a standard relative deformation/time curve.

BRIEF DESCRIPTION OF THE DRAWINGS

The invention will now be further described with reference to the accompanying drawings, which illustrate an embodiment of the machine according to the invention in which;

FIG. 1 is a diagrammatic view of a part of an automatic wire bonding machine, comprising means for monitoring the quality of the bond showing the bonding head with the transducer with bonding wedge and wire clamp;

FIG. 2 is a view in enlarged scale, showing the deformation of the bonding wire;

FIG. 3 is a graph showing wedge position against time, with curves indicating satisfactory and unsatisfactory bonding;

DETAILED DESCRIPTION

Figure 4:
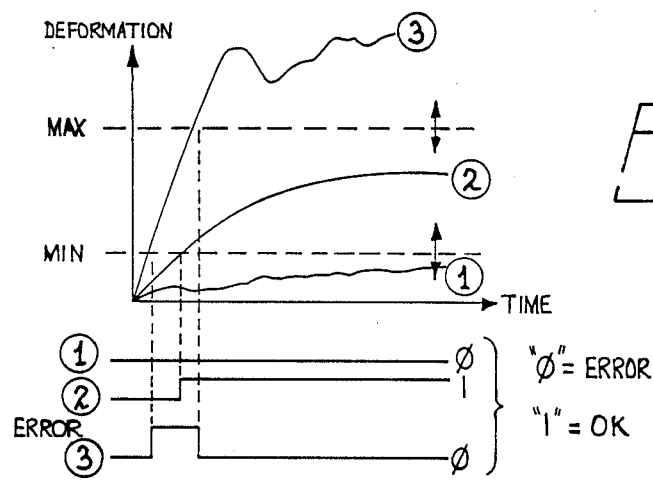
FIG. 4 shows the generation of an error signal when bonding is unsatisfactory.

As can be seen from FIG. 1, an automatic wire bonding machine comprises a bonding wedge 2 which is attached to a horn 4 of an ultrasonic vibration transducer 6. The horn 4 is pivoted at 24 and comprises an upwardly extending plate 20 which is urged clockwise by a bondweight spring 14. Wire 8 for bonding to a component 16 is fed from a wire feed spool 10 to jaws 12 of a wire clamp (not shown). The bondweight spring 14 is provided to apply, in known manner, a force to the bonding wire 8 where it touches the surface 16 to which the wire 8 is to be bonded. The machine also comprises distance measuring equipment comprising a sensor 18 to measure the movement of the plate 20, in the direction 22, during a bonding operation. It will be seen that movement of the plate 20 is directly proportional to movement of the wedge 2, which is itself directly dependent on the deformation of the bonding wire 8 during the bonding process.

In operation of the machine, the wedge 2 is first brought in contact with the wire 8 against the component 16. Control means (not shown) then allows the spring 14 to assert itself to cause a predeformation of the wire 8 by the wedge 2 and the plate 20 to move into a zero position. The reading of the sensor 18, that is the level after predeformation, is taken as the zero value for the measurement of deformation on ultrasonic excitation. The ultrasonic transducer 6 is then switched on, and the wedge 2 causes further deformation of the wire 8 to bond the wire to the component 16 and movement of the wedge 2 is sensed by the sensor 18. When there is no further deformation, the ultrasonic transducer 6 is switched off, thus ensuring that the ultrasonic excitation time for each bond is minimised, while ensuring that bond quality is acceptable, thereby optimising the machine utilisation.

The movement of the plate 20 is sensed by the sensor 18 and signals indicating the position of the wedge 2 are fed to control circuitry diagrammatically shown in FIG. 3.

FIG. 2 shows, in an enlarged scale, the deformation of the wire 8, due to the effect of the wedge 2.

Figure 5:
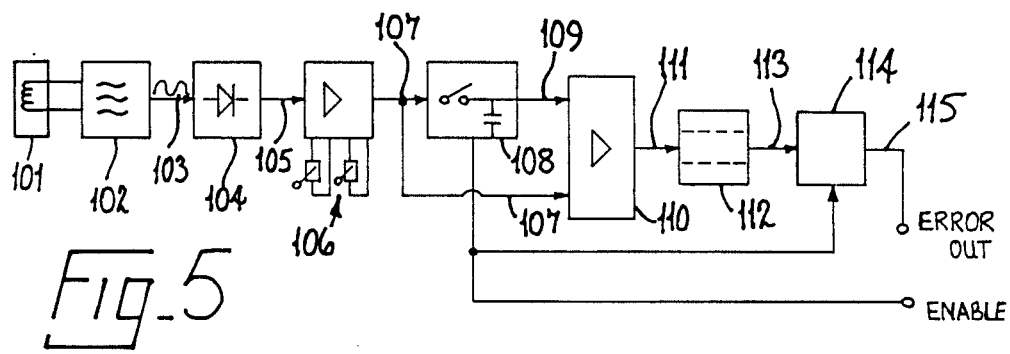
FIG. 5 is a block diagram showing the monitoring of wire bond formation.

FIG. 5 is a block diagram, showing how the sensor according to the invention is used to control an automatic wire bonding machine.

A linear sensor 101 senses the movement of a metal plate, and produces amplitude variations in a sine-wave oscillator 102. The variable AC Signal 103 is fed to a rectifier 104, which converts the AC-Signal to a DC-Voltage 105. The variations in DC-Voltage are small, so are therefore amplified at an amplifier 106, which produces an amplified signal 107.

The amplified signal 107 represents a direct measurement of the distance between the moving metal plate and the sensor 101. As ultrasonic power is switched on; the "enable" signal is raised by the bonder. At this point, the initial distance of the plate to the sensor 101, as represented by signal 107, is memorized in a "sample and hold" circuit 108.

The memorized signal 109, and the new signal 107 are fed to a differential amplifier 110. The output 111 of this amplifier gives an absolute value for the wire deformation in real time, as the ultrasonic power is applied.

The deformation signal 111 is tested by the window discriminator 112, to see whether it is within the two (adjustable) limits, that is the maximum and minimum allowable deformations as shown in FIG. 4.

When the ultrasonic energy is switched off, the enable signal is switched back to the inactive state. With this switching, the error signal 113 is latched in at the error latch 114 and is available to control the bonder.

After a short time delay, the sample and hold circuit 108 is switched back into the sample mode, and the system is ready for the next measurement.

Figure 6:
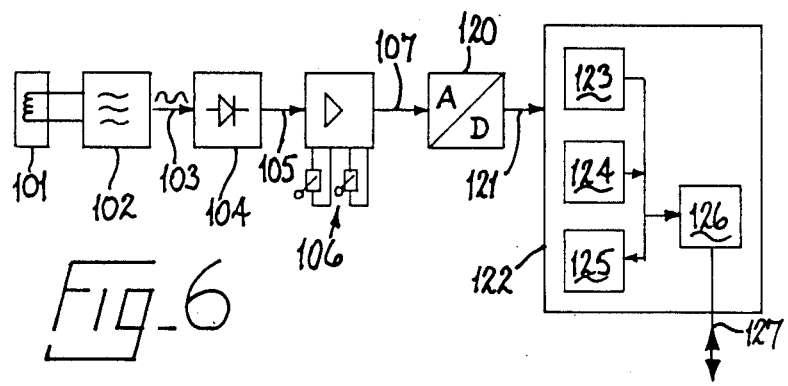
FIG. 6 is a block diagram showing the monitoring of wire bond formation and analysis of the relative deformation/time curve.

FIG. 6 is a block diagram, showing additional means to FIG. 5, showing how the sensor according to the invention can additionally be used to analyse the relative deformation/time curve and compare it with a standard relative deformation/time curve.

The pre-processing of the signal coming from the sensor is identical up to point 107 in FIGS. 5 and 6. At point 107, a computer controlled analog to digital converter 120 produces a digital signal 121 which can be processed by a microcomputer system 122 which uses a special program to analyse the relative deformation/time curve in addition to the processing already discussed in the description of FIG. 5 above. The microprocessor system 122 comprises a central processing unit 123, a programmable memory 124 and a data memory 125 which are linked via a host interface 126 to a host computer link 127. Information on bond quality and the deformation/time curve is continuously relayed to the host computer during the bonding operation.

The following sequence of operations is suitably followed, to use the means for bond quality control according to the invention, in a practical system for monitoring an automatic wire bonding process.

During the wire bonding process, bonds are formed between the wire and different contact surfaces, having different characteristics. For example, where the wire is being used to make a connection between a component and a substrate, different bonding parameters, such as bonding time and bonding power, are required for the wire/substrate bond and the wire/component bond. The bonding parameters required for a particular bond are specified as a channel of the ultrasound generator.

Step 1
Vertical axis in home position.

Step 2
The ultrasound generator channel is selected. The linear sensor voltage is sampled and stored as a reference.

Step 3
The wedge is moved vertically to a ramp position. At the ramp position, which is close to the position at which the wedge is expected to contact the surface to which the wire is to be bonded, the wedge is then moved more slowly.

Step 4
When the vertical movement to the Ramp Position is completed, the wire clamp is opened and the sensor is activated with a touch down sensor function.

Step 5
The Bondweight is switched on, and the wire is predeformed.

Step 6
The wedge is moved vertically to the bondheight, which corresponds to the actual height of the substrate or component. The actual sensor voltage is compared continuously to the stored reference voltage. Vertical motion is stopped when the voltage difference has the programmed value, which shows that the wire has touched the surface and gives the absolute over-travel distance. The actual voltage is stored as a new reference value for bond quality evaluation.

Step 7
The Ultrasonic generator is switched on. The voltage change of the distance sensor, which is caused by the deformation of the wire with the US-power, is sampled.

Step 8
The US-Generator is switched off. The wire clamp is closed. The shape of the deformation curve is evaluated to determine whether it meets the programmed specifications. The machine is stopped if the deformation is not within the preset limits.

Step 9
The wedge is moved vertically to return to the Zero-Position.

In operation, the equipment according to the invention is used to determine whether the bonds being formed by an automatic wire bonding machine are within the specification required for their intended end use. The equipment would normally be supplied pre-programmed for standard requirements, but is freely programmably for any particular end use specification. In practice, the operator would record the deformation for a number of satisfactory and unsatisfactory bonds, and from this ascertain the maximum and minimum levels for acceptable bond quality.

FIG. 3 is a graph of bonding wedge height against time, for a number of different sets of bonding conditions. During the bonding operation, the height of the wedge corresponds to the deformation. The deformation represents the zero level, that is the reference level after predeformation from which the absolute value of the wire deformation due to US excitation is measured. The time represents the end of predeformation, when the ultrasonic power is switched on. The time represents the end of deformation and the points for each curve a, b, c and d represent the times at which the US power is switched off. Curve A shows a bond in which the deformation is good, and the bonding satisfactory. Curve B shows a bond where the ultrasonic energy has been switched on for too long. While the bond is satisfactory, the additional ultrasonic time is a wasted time which reduces the throughput of the machine.

Curve C shows a bond where the deformation is too high. Under such circumstances, the wire would be flattened too much. It is normally acceptable for the wire to be flattened so that the final horizontal dimension is up to $2\frac{1}{2}$ times its initial diameter. Where the wire is flattened too much, the finished bond occupies too much of the surface of the component. A further disadvantage of over bonding is that the wire will tend to break at the heel, close to the bond, when the wire is pulled, with insufficient strength. Over deformation is caused by too high a bondweight, too high ultrasonic energy or too long an ultrasonic excitation time, coupled with the energy being too high.

Curve D shows a bond where the deformation is not sufficiently high. This results in a bond between the wire and the surface which is too weak, with a tendency for the wire to lift off and come away from the substrate.

As a general rule, one would expect satisfactory bonding where the predeformation is a maximum of one-third of the total deformation, the remaining two-thirds being due to ultrasonic excitation.

The dotted lines on the graph in FIG. 4 labelled max and min indicate the maximum and minimum allowable limits for the deformation. As can be seen from the double headed arrows, and as has been discussed above, these maximum and minimum limits can be adjusted depending on the end use requirements of the device or component being bonded.

As is shown in FIG. 4, curve 2 falls within the maximum and minimum limits for deformation, and so generates an error signal "1" which means that the bond is acceptable. Curve 1 falls below the minimum level for deformation, and so generates an error signal "0" which means that the bond is unacceptable. Curve 3 is above the maximum limit for deformation, and so also generates an error signal "0".

Figure 7:
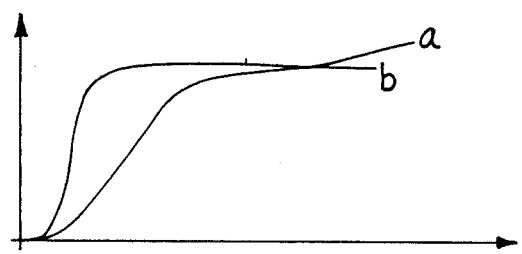
FIG. 7 is a graph showing relative deformation against time, with curves indicating satisfactory and unsatisfactory deformation/time characteristics.

As is shown in FIG. 7, the shape of the curve of relative deformation against time during ultrasonic bonding can be used to check the quality of the bond. The curve (a) shows correct deformation/time performance. However, in curve (b), the maximum deformation is reached in a very short time, compared to the average time which is needed to reach the maximum relative deformation. This can be due to a number of reasons: for example, the bonding wire may not have been placed accurately under the wedge, the surface may not have been of acceptable quality or the bond height sensing may have been incorrect.

The shape of the deformation/time curve can give information about possible bond problems and can also indicate a deterioration in bond quality, where bonds still meet the deformation requirements, so that the operator can stop the bonding process and make any necessary adjustments to the machine before a sensing problem develops.

We claim:

1. A wire bonding apparatus for bonding aluminum wire to the contact surface of an electronic component comprising
    an ultrasonic vibration transducer, including a horn,
    a bonding wedge secured to one end of said horn, representative of the displacement of said bonding wedge,
    means for converting said sinusoidal signal to a DC voltage representing a direct measurement of the movement of said bonding wedge, and
    means for defining an acceptable window of acceptable DC voltages at the conclusion of a bonding operation.

2. A wire bonding apparatus according to claim 1 wherein said generating means comprises a sine-wave oscillator.

3. A wire bonding apparatus according to claim 2 wherein said converting means comprises rectifier means.

* * * * *